United States Patent
Ama et al.

(10) Patent No.: US 11,921,577 B2
(45) Date of Patent: Mar. 5, 2024

(54) SEMICONDUCTOR STORAGE ELEMENT, SEMICONDUCTOR STORAGE DEVICE AND SYSTEM-ON-CHIP

(71) Applicant: LAPIS Semiconductor Co., Ltd., Yokohama (JP)

(72) Inventors: Kota Ama, Yokohama (JP); Tetsuya Tanabe, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 128 days.

(21) Appl. No.: 17/407,101

(22) Filed: Aug. 19, 2021

(65) Prior Publication Data
US 2022/0058082 A1 Feb. 24, 2022

(30) Foreign Application Priority Data
Aug. 24, 2020 (JP) ................ 2020-141267

(51) Int. Cl.
| | |
|---|---|
| *G06F 11/10* | (2006.01) |
| *G06F 1/28* | (2006.01) |
| *G11C 11/4074* | (2006.01) |
| *H03K 19/20* | (2006.01) |

(52) U.S. Cl.
CPC ............ *G06F 11/1064* (2013.01); *G06F 1/28* (2013.01); *G11C 11/4074* (2013.01); *H03K 19/20* (2013.01)

(58) Field of Classification Search
CPC .... G06F 11/1064; G06F 1/28; G06F 11/1048; G06F 11/3058; G06F 12/16; G06F 13/1668; G11C 11/4074; G11C 7/1063; G11C 7/24; G11C 29/42; H03K 19/20
See application file for complete search history.

(56) References Cited

U.S. PATENT DOCUMENTS

| | | | |
|---|---|---|---|
| 2006/0056258 A1* | 3/2006 | Eto | G11C 11/4076 365/222 |
| 2008/0098277 A1* | 4/2008 | Hazelzet | G06F 11/1044 714/753 |
| 2013/0301373 A1* | 11/2013 | Tam | G11C 5/143 365/228 |
| 2018/0189132 A1* | 7/2018 | Malladi | G06F 21/64 |
| 2021/0271541 A1* | 9/2021 | Shim | G06F 11/0787 |

FOREIGN PATENT DOCUMENTS

JP 2015011385 1/2015

* cited by examiner

*Primary Examiner* — Thien Nguyen
(74) *Attorney, Agent, or Firm* — JCIPRNET

(57) ABSTRACT

The disclosure provides a semiconductor storage element which is provided with an error detection and correction circuit and, when an uncorrectable error occurs in the semiconductor storage element, capable of promptly transferring the occurrence to the outside, and provides a semiconductor storage device and a system-on-chip using the same. The semiconductor storage element includes a storage part storing data, an error detection and correction part detecting an error in the data stored in the storage part and correcting the error if possible, a monitoring part issuing an uncorrectable error signal when an uncorrectable error occurs in the error detection and correction part, and a terminal transmitting the uncorrectable error signal to the outside.

6 Claims, 4 Drawing Sheets

ID/SEMICONDUCTOR STORAGE ELEMENT, SEMICONDUCTOR STORAGE DEVICE AND SYSTEM-ON-CHIP

CROSS-REFERENCE TO RELATED APPLICATION

This application claims priority under 35 USC 119 from Japanese Patent Application No. 2020-141267, filed on Aug. 24, 2020, the disclosure of which is incorporated by reference herein.

BACKGROUND

Technical Field

The disclosure relates to a semiconductor memory element, a semiconductor memory device, and a system-on-chip.

Related Art

Conventionally, a semiconductor memory element may be provided with a function of detecting an error in data when reading the data from a memory cell and further correcting the error if possible. For example, a method using an ECC (Error Checking and Correction) circuit is known as one of the methods for realizing such a function.

For example, Patent Document 1 (Japanese Patent Application Laid-Open (JP-A) No. 2015-011385) can be mentioned as a document that discloses technology related to the ECC circuit. An error correction part 20A of the semiconductor device according to Patent Document 1 is an ECC circuit. When detecting that there is a correctable error in a data signal DTM read from a memory 10A by a read operation, the error correction part 20A corrects the error in the data signal DTM. In addition, the error correction part 20A outputs corrected data DTC to a controller 30 and further outputs information indicating the corrected data DTC to a monitoring circuit 40. A detector 60 provided in the monitoring circuit 40 detects any one of a plurality of error modes indicating the characteristics of the error generated in the memory 10A and outputs the same to the controller 30.

Here, as described above, the ECC circuit built in the semiconductor memory device may or may not be able to correct the error after detecting the error due to formal restrictions. If the error can be corrected, there is no problem, but if the error cannot be corrected, it is assumed that the error will cause a malfunction or the like in the apparatus equipped with the semiconductor memory device. In such a case, the apparatus equipped with the semiconductor memory device needs to take necessary measures such as stopping a predetermined function of the apparatus as quickly as possible. Therefore, it is required to promptly notify the semiconductor memory device of the occurrence of an uncorrectable error.

The disclosure provides a semiconductor memory element which is provided with an error detection and correction circuit and, when an uncorrectable error occurs in the semiconductor memory element, capable of promptly transferring the occurrence to the outside, and provides a semiconductor memory device and a system-on-chip using the same.

SUMMARY

A semiconductor memory element according to the disclosure includes: a memory part storing data; an error detection and correction part detecting an error in the data stored in the memory part and correcting the error if possible; an uncorrectable error detection part issuing an uncorrectable error signal when an uncorrectable error occurs in the error detection and correction part; and a terminal transmitting the uncorrectable error signal to outside.

A semiconductor memory device according to the disclosure includes: the above semiconductor memory element; and a package on which the semiconductor memory element is mounted and which includes a pin for transmitting the uncorrectable error signal transmitted from the terminal to the outside. The pin is an empty pin in the package.

A system-on-chip according to the disclosure includes: the above semiconductor memory element formed on a semiconductor chip; a functional part formed on the semiconductor chip and executing a predetermined function using the semiconductor memory element; and a control part formed on the semiconductor chip and controlling the semiconductor memory element and the functional part and receiving the uncorrectable error signal. The control part executes a predetermined process on at least one of the semiconductor memory element and the functional part when receiving the uncorrectable error signal.

DETAILED DESCRIPTION

First Embodiment

A semiconductor memory element 10 according to the present embodiment will be described with reference to FIG. 1. In the present embodiment, a DDR-SDRAM (Double Data Rate-Synchronous Dynamic Random Access Memory) is illustrated as an example of the semiconductor memory element 10, and hereinafter, a failure detection method in the DDR-SDRAM and a notification method thereof will be described.

Figure 1:
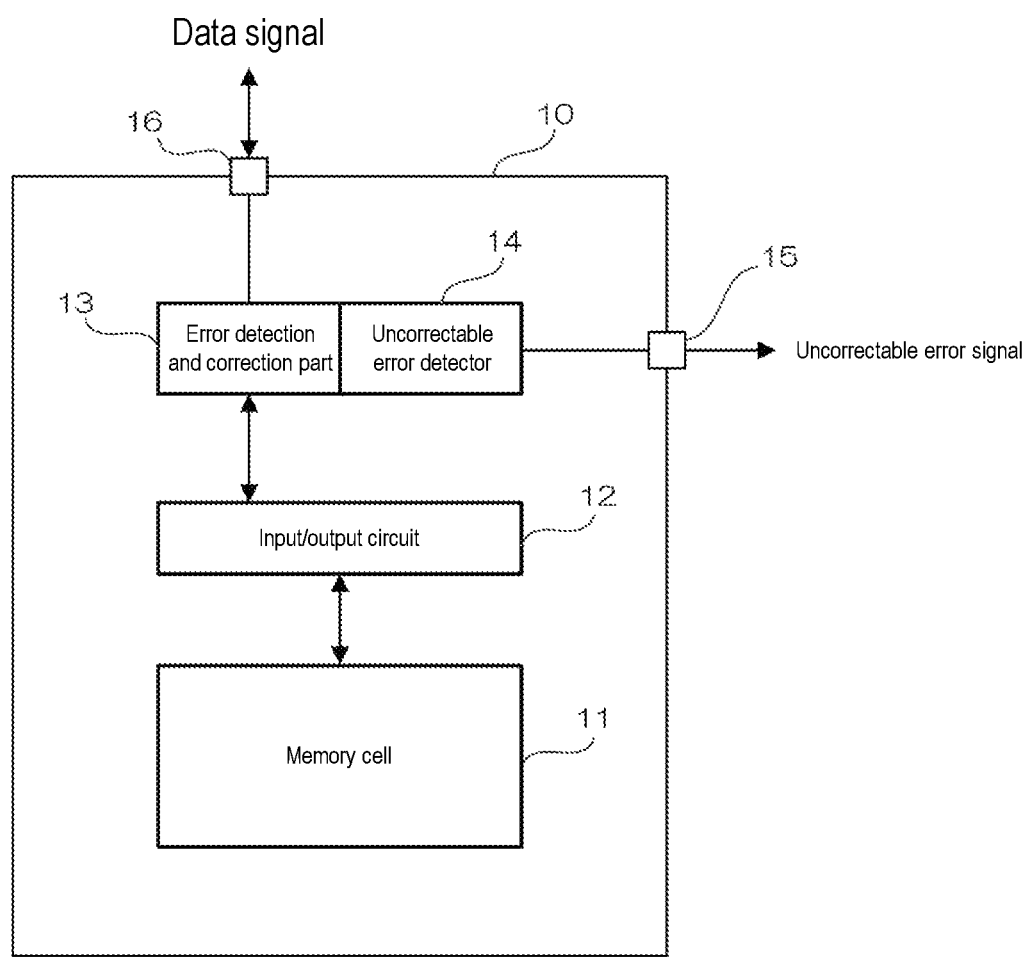
FIG. 1 is a block diagram showing an example of a configuration of a semiconductor memory element according to the first embodiment.

As shown in FIG. 1, the semiconductor memory element 10 includes a memory cell 11, an input/output circuit 12, an error detection and correction part 13, and an uncorrectable error detector 14. As an example, the semiconductor memory element 10 is realized by a semiconductor integrated circuit (semiconductor chip) in which the memory cell 11, the input/output circuit 12, the error detection and correction part 13, and the uncorrectable error detector 14 are integrated.

The memory cell 11 is an aggregate of unit memory areas for storing data in predetermined units. The input/output circuit 12 is an address circuit that designates the unit memory area for storing data of a predetermined unit in the memory cell 11. The data to be written to the memory cell 11 or the data to be read from the memory cell 11 is input or output from a terminal 16 (a pad of the semiconductor memory element 10). In the present embodiment, the terminal 16 is, for example, built in an MCU (Micro Controller Unit, not shown) or the like that controls the entire apparatus provided with the semiconductor memory element 10, or connected to a memory controller disposed outside. The write data input is written to the memory cell 11 via the error detection and correction part 13 and the input/output circuit 12. The read data read from the memory cell 11 is output from the terminal 16 via the input/output circuit 12 and the error detection and correction part 13.

The error detection and correction part 13 is a part that detects whether there is an error in the data read from the memory cell 11 and corrects the error if possible. In the present embodiment, an ECC circuit is used as an example of the error detection and correction part 13. As an example, the ECC circuit used in the present embodiment has functions of detecting and correcting the following items.

(1) No error
(2) Detection and correction of an error of 1 bit
(3) Detection and notification of an error of 2 bits or more The uncorrectable error detector 14 is a part that detects that an uncorrectable error occurs in the error detection and correction part 13. That is, in the semiconductor memory element 10 according to the present embodiment, detection of an error of 2 bits or more in (3), among the above-mentioned functions of the ECC circuit, is detected, and an uncorrectable error signal notifying that an uncorrectable error is detected is transmitted to the outside from a terminal 15 (a pad of the semiconductor memory element 10). The uncorrectable error signal transmitted from the terminal 15 is sent to, for example, the above-mentioned MCU or the like. The MCU also monitors the failure of the semiconductor memory element 10, and receives the uncorrectable error signal to determine that an abnormality occurs in the semiconductor memory element 10 and the data read from the memory cell 11 is unreliable. When it is determined that the read data is unreliable, a predetermined process, for example, stopping a predetermined part of the apparatus equipped with the semiconductor memory element 10, is performed.

Here, the semiconductor memory element 10 may be mounted in a system, for example, a vehicle, which has strict requirements for malfunction. It is assumed that if a problem occurs in the vehicle, the vehicle may be endangered or out of control. Therefore, in order to manage and minimize the risk of system abnormality, the automobile industry has established the functional safety standard ISO26262. Although various items related to safety are defined in ISO26262, as an example of the items related to the semiconductor memory element 10, a function of reliably and promptly detecting an operation failure is required.

For the semiconductor memory element 10 mounted on a vehicle or the like, when an uncorrectable error occurs, the erroneous data may be propagated, which may pose a serious risk to the vehicle or the like. Therefore, in the semiconductor memory element 10 according to the present embodiment, the uncorrectable error detector 14 is provided inside the semiconductor memory element 10 in order to notify the abnormality of the memory cell 11 and the abnormality of the data stored in the memory cell 11 as quickly as possible. Then, when an uncorrectable error is detected, an uncorrectable error signal indicating that an uncorrectable error is detected is transmitted to, for example, the MCU or the like that is a higher-level control part. Thus, the MCU can grasp the occurrence of an abnormality in the semiconductor memory element 10 almost at the same time and perform required processing. As a result, according to the semiconductor memory element 10 of the present embodiment, when an uncorrectable error occurs in the semiconductor memory element provided with the error detection and correction circuit, the occurrence can be promptly transferred to the outside.

Here, a method in which parity is placed on the data output from the terminal 16 to perform error detection calculation at the connection destination, for example, the MCU, is also an error detection method for the semiconductor memory element 10. In other words, it is a method of assigning a check code of several bits to a data width of a certain unit and performing error detection calculation in the MCU. In the semiconductor memory element 10 according to the present embodiment, an error in the data stored in the memory cell 11 may be sent to the outside by this method. However, in the above method, for example, a correction code of 8 bits is required for a data width of 64 bits, which puts pressure on the data rate of the data signal and requires time for calculation, so from the viewpoint of immediacy, the method of the semiconductor memory element 10 is superior. In other words, since the semiconductor memory element 10 according to the present embodiment outputs the detection result of the ECC directly, excellent immediacy is achieved. For example, when the terminal arrangement of the semiconductor memory element 10 is determined by a predetermined standard, an empty terminal in which nothing is specified is selected as the terminal for transmitting an uncorrectable error signal.

Second Embodiment

A semiconductor memory device 20 according to the present embodiment will be described with reference to FIG. 2. The present embodiment is a form in which the semiconductor memory element 10 according to the above embodiment is mounted on a package.

Figure 2:
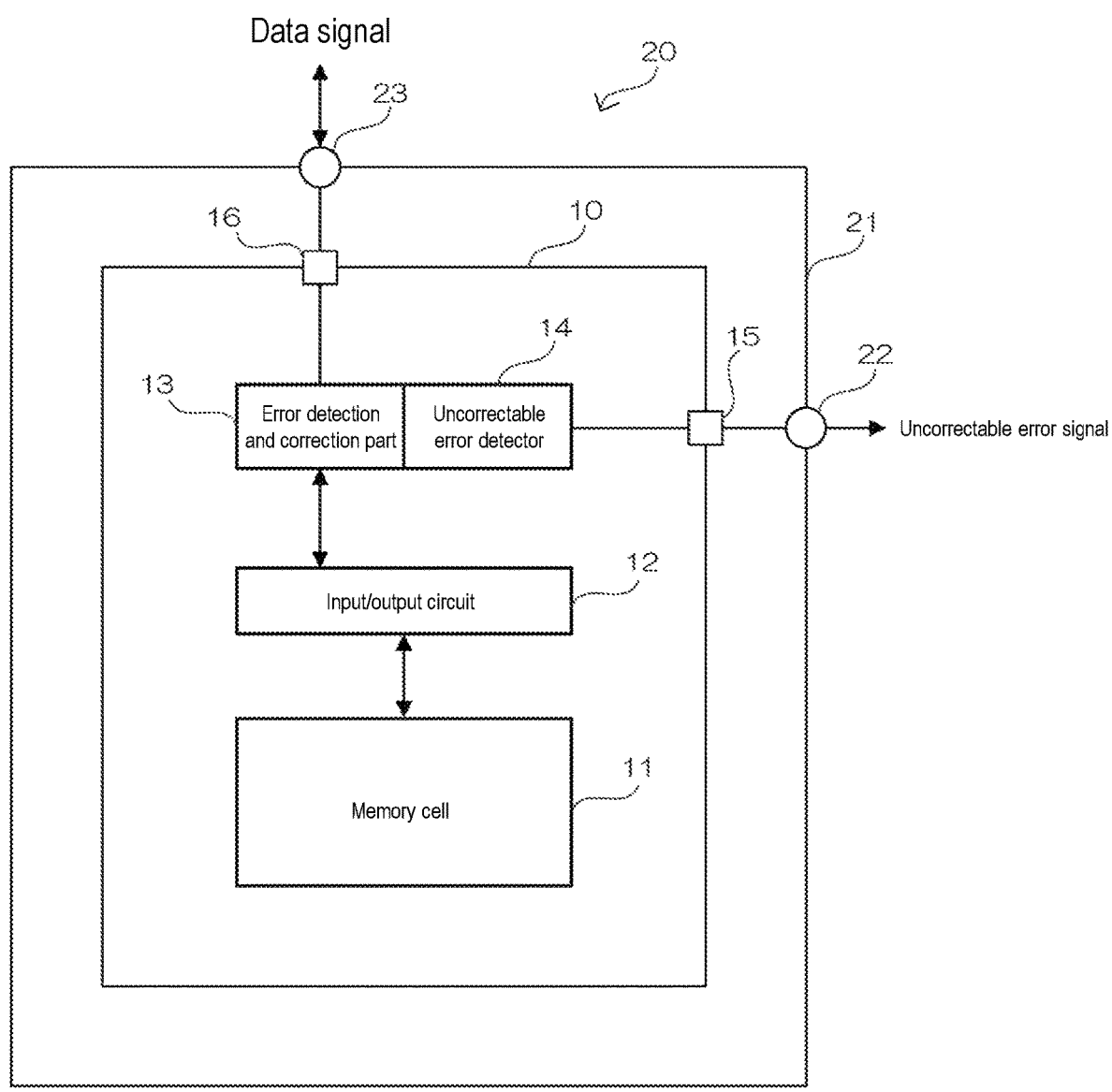
FIG. 2 is a block diagram showing an example of a configuration of a semiconductor memory device according to the second embodiment.

As shown in FIG. 2, the semiconductor memory device 20 includes a semiconductor memory element 10 and a package 21. Since the semiconductor memory element 10 is the same as the semiconductor memory element 10 according to the above embodiment, the same configurations are denoted by the same reference numerals, and detailed description thereof is omitted.

A terminal 15 of the semiconductor memory element 10 is connected to a pin 22 of the package 21, and a terminal 16 is connected to a pin 23 of the package 21. In other words, when viewed from the appearance of the package 21, the uncorrectable error signal is output from the pin 22, and the data signal is input/output via the pin 23.

Here, in the semiconductor memory device 20 according to the present embodiment, the pin 22 is an NC (Non Connection) pin of the package 21, that is, an empty pin. The NC pin is a pin that is not connected to any of the terminals of the semiconductor memory element 10 among the pins of the package 21, in other words, a surplus pin. By assigning the NC pin as the output pin of the uncorrectable error signal, the uncorrectable error signal can be promptly transmitted to the outside without providing the package 21 with a dedicated output pin. Further, by transmitting the uncorrectable error signal to the MCU or the like provided outside, the MCU or the like can promptly detect the abnormality of the semiconductor memory device 20 and can execute required processing at an appropriate timing.

As described above, according to the semiconductor memory device 20 of the present embodiment, when an uncorrectable error occurs in the semiconductor memory device provided with the error detection and correction circuit, the occurrence can be promptly transferred to the outside.

Third Embodiment

A system-on-chip 30 according to the present embodiment will be described with reference to FIG. 3. The system-on-chip is a semiconductor integrated circuit designed to function as a system by integrating and coordinating functions for application purposes in addition to the functions of a general microcontroller such as a processor core on one chip of the semiconductor integrated circuit. The system-on-chip 30 uses a configuration equivalent to the above semiconductor memory element 10 as a memory means included in the system-on-chip 30.

Figure 3:
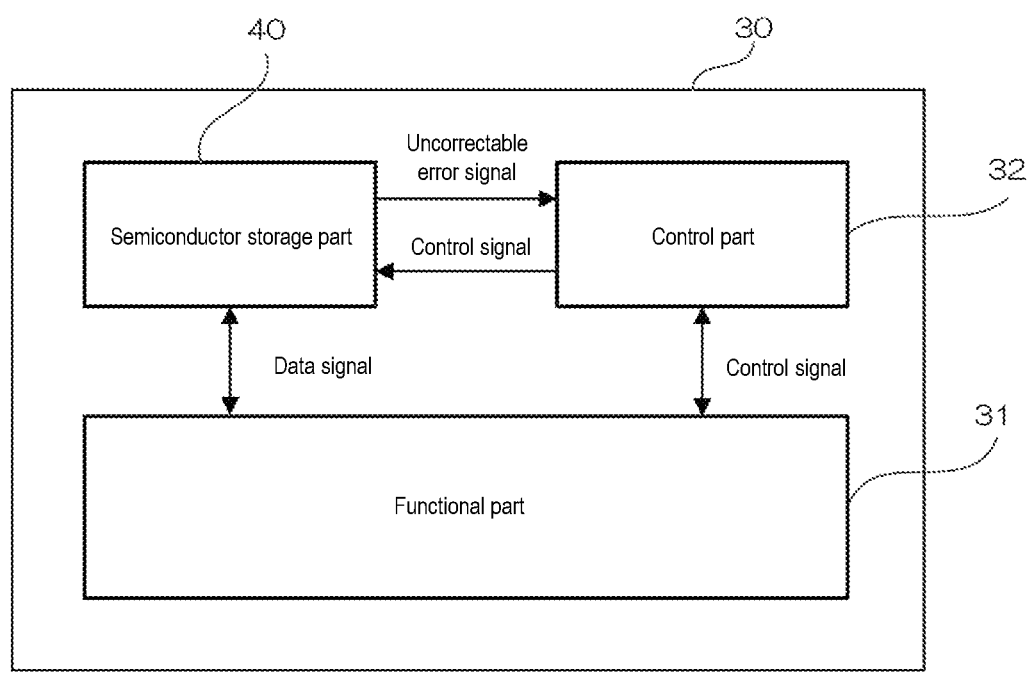
FIG. 3 is a block diagram showing an example of a configuration of a system-on-chip according to the third embodiment.

As shown in FIG. 3, the system-on-chip 30 according to the present embodiment includes a semiconductor memory part 40, a functional part 31, and a control part 32. The semiconductor memory part 40 is a part where the circuits included in the semiconductor memory element 10 are integrated, and has the same functions as the semiconductor memory element 10.

The functional part 31 is a part where the functions realized in the system-on-chip 30 are integrated. In the present embodiment, the functional part 31 transmits and receives a data signal to and from the semiconductor memory part 40 when executing predetermined functions.

The control part 32 is a part that controls the entire system-on-chip 30, and is composed of, for example, an MCU.

When an uncorrectable error is detected in the data read from the memory cell 11 (see FIG. 1) in the exchange of the data signal with the functional part 31, the semiconductor memory part 40 transmits an uncorrectable error signal to the control part 32. The control part 32 receiving the uncorrectable error signal transmits a control signal to at least one of the semiconductor memory part 40 and the functional part 31, and executes required processing such as stopping the semiconductor memory part 40 and the functional part 31 on the semiconductor memory part 40 and the functional part 31.

That is, according to the system-on-chip 30 of the present embodiment, when an uncorrectable error occurs in reading the data of the memory cell 11, the control part 32 can be notified immediately, and the control part 32 can promptly execute the required processing. As a result, serious failures caused by, for example, propagation of the malfunction can be avoided. Further, the control part 32 (MCU as an example) is also notified of the failure in the functional part 31, but according to the system-on-chip 30, the control part 32 can clearly separate the abnormality in the data of the semiconductor memory part 40 from other failures.

As described above, with the system-on-chip 30 according to the present embodiment, when an uncorrectable error occurs in the semiconductor memory device provided with the error detection and correction circuit, the occurrence can be promptly transferred to the outside (in the present embodiment, an MCU or the like provided in the same semiconductor integrated circuit).

Fourth Embodiment

Figure 4:
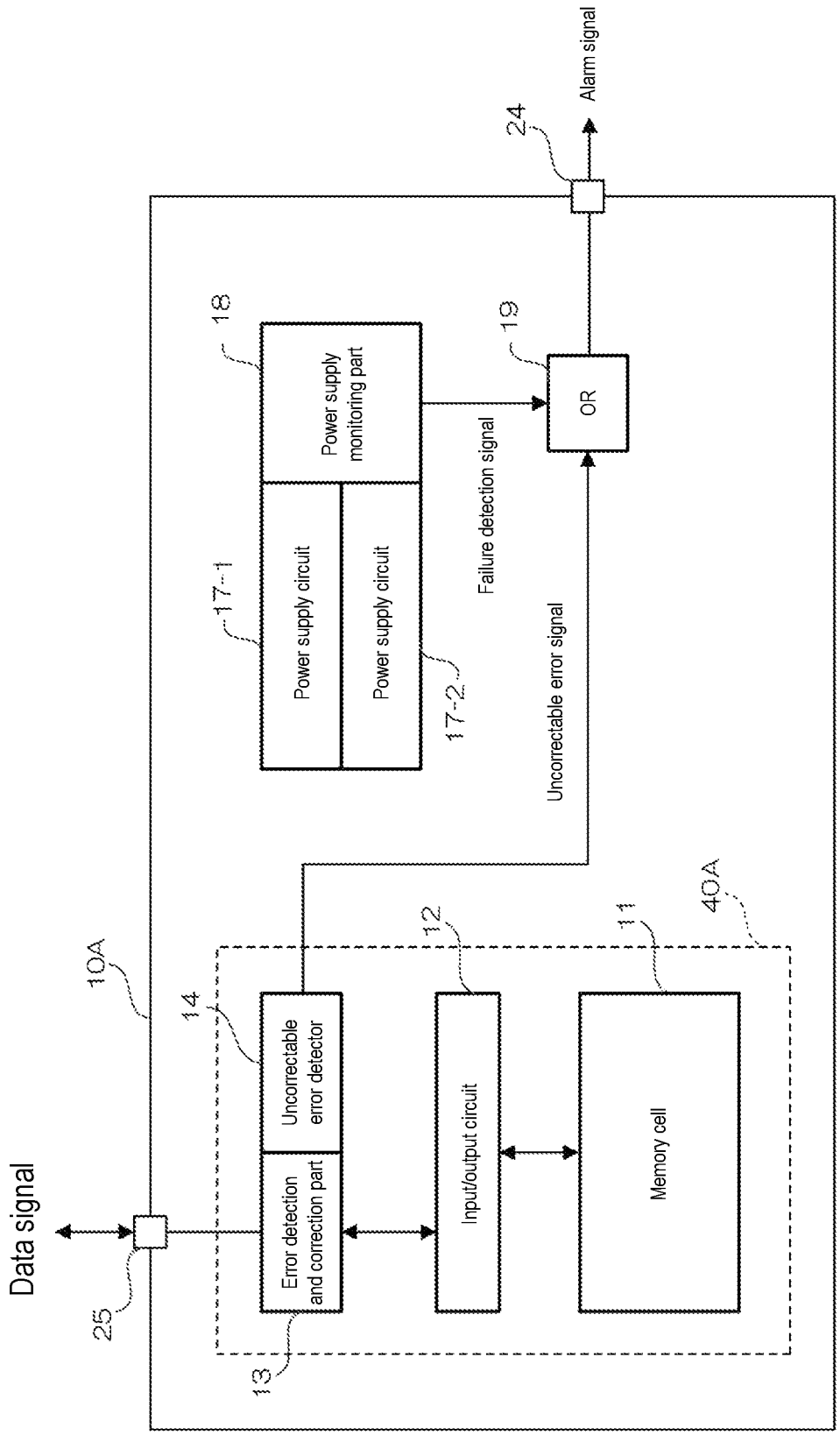
FIG. 4 is a block diagram showing an example of a configuration of a semiconductor memory element according to the fourth embodiment.

A semiconductor memory element 10A according to the present embodiment will be described with reference to FIG. 4. The present embodiment is a form in which the semiconductor memory element includes a function of monitoring a power supply for operating each part of the semiconductor memory element. As shown in FIG. 4, the semiconductor memory element 10A includes a semiconductor memory part 40A, power supply circuits 17-1 and 17-2, a power supply monitoring part 18, and an OR 19 (OR circuit). In the semiconductor memory element 10A, a data signal is input/output via a terminal 25.

In FIG. 4, the semiconductor memory part 40A is a part where the circuits included in the semiconductor memory element 10A are integrated, and has the same functions as the semiconductor memory element 10. Therefore, the same configurations are denoted by the same reference numerals, and detailed description thereof is omitted.

The power supply circuit 17-1 is a power supply circuit for operating the semiconductor memory part 40 and the like, and the power supply circuit 17-2 is a circuit for generating a reference voltage for operating the power supply circuit 17-1. The power supply monitoring part 18 is a part that monitors the operations of the power supply circuits 17-1 and 17-2.

The semiconductor memory element 10A operates as follows. That is, the power supply monitoring part 18 compares the voltage of the power supply circuit 17-1 with the reference voltage of the power supply circuit 17-2, and monitors whether the difference (potential difference) between the two voltages is within a predetermined range. When the potential difference exceeds the predetermined range, a failure detection signal is output.

Furthermore, the semiconductor memory part 40A outputs an uncorrectable error signal when an uncorrectable error occurs in the semiconductor memory part 40A in the same manner as the semiconductor memory element 10. The uncorrectable error signal and the failure detection signal are ORed by the OR 19 (OR circuit), and the result of the OR is output from a terminal 24 as an alarm signal. That is, in the semiconductor memory element 10A, the alarm signal is issued from the terminal 24 when a failure occurs in at least one of the semiconductor memory part 40A and the power supply circuits 17-1 and 17-2. The alarm signal is transmitted to, for example, an MCU or the like provided outside the semiconductor memory element 10A.

As described above, in the semiconductor memory element 10A, besides the case where an uncorrectable error occurs in the semiconductor memory part 40A, when a failure occurs in the power supply circuits 17-1 and 17-2, the failure can also be sent to the outside.

Here, although the present embodiment illustrates an example that the signal that is ORed with the uncorrectable error signal is used as the failure detection signal of the power supply circuit, the disclosure is not limited thereto, and a failure detection signal indicating a failure of another circuit part may also be used. Further, the number of failure detection signals that are ORed with the uncorrectable error signal is not necessarily one, and may be more than one. If the number of failure detection signals that are ORed with the uncorrectable error signal is increased, more failure detection signals can be sent to the outside with fewer terminals.

Although the present embodiment illustrates the semiconductor memory element 10A in the form of a semiconductor integrated circuit as an example, the disclosure is not limited thereto. For example, the semiconductor memory element 10A may be mounted on a package similar to the semiconductor memory device 20. At this time, the alarm signal may be output from the NC pin of the package. In this way, the failure detection signal can be promptly sent to the outside without providing a dedicated terminal.

As described above, with the semiconductor memory element 10A according to the present embodiment, when an uncorrectable error occurs in the semiconductor memory element provided with the error detection and correction circuit, the occurrence can be promptly transferred to the outside.

Although the present embodiment illustrates a mode in which a plurality of failure detection signals are ORed and then output as an example, when there is a margin in the number of terminals of the semiconductor memory element or the number of pins of the package, the plurality of failure detection signals may be transmitted from individual terminals or pins, or the failure detection signals may be divided into groups and transmitted in groups.

According to the embodiment, the semiconductor storage element which is provided with an error detection and correction circuit and, when an uncorrectable error occurs in the semiconductor storage element, capable of promptly transferring the occurrence to the outside, and a semiconductor storage device and a system-on-chip using the same can be provided.

What is claimed is:

1. A semiconductor memory element, comprising:
   a memory part storing data;
   an input/output circuit through the data is read from or written to the memory part;
   an error detection and correction part coupled to the input/output circuit and detecting an error in the data stored in the memory part and correcting the error if possible;
   a first terminal that is a pad of the semiconductor memory element, coupled to the error detection and correction part and through which the data is written to or read from the memory part;
   an uncorrectable error detection part coupled to the error detection and correction part and issuing an uncorrectable error signal when an uncorrectable error occurs in the error detection and correction part; and
   a second terminal coupled to the uncorrectable error detection part and transmitting the uncorrectable error signal to an MCU (micro central unit) or a higher-level control part when an uncorrectable error is detected, so that the uncorrectable error is determined at a same time as an occurrence of an abnormality in the semiconductor memory element,
   wherein the second terminal is different from the first terminal and is a non-specified pad of the semiconductor memory element.

2. A semiconductor memory device, comprising:
   the semiconductor memory element according to claim 1; and
   a package on which the semiconductor memory element is mounted and which comprises a pin for transmitting the uncorrectable error signal transmitted from the terminal to the outside,
   wherein the pin is an empty pin in the package.

3. The semiconductor memory device according to claim 2, wherein the uncorrectable error signal is transmitted to a microcontroller unit provided outside the semiconductor memory device.

4. The semiconductor memory device according to claim 2, wherein the semiconductor memory element further comprises:
   a power supply circuit for operating the semiconductor memory element;
   a monitoring part issuing a failure detection signal when a failure occurs in the power supply circuit; and
   an OR logic which ORs the uncorrectable error signal and the failure detection signal,
   wherein a pin for transmitting an output from the OR logic to the outside is the empty pin.

5. The semiconductor memory device according to claim 3, wherein the semiconductor memory element further comprises:
   a power supply circuit for operating the semiconductor memory element;
   a monitoring part issuing a failure detection signal when a failure occurs in the power supply circuit; and
   an OR which ORs the uncorrectable error signal and the failure detection signal,
   wherein a pin for transmitting an output from the OR to the outside is the empty pin.

6. A system-on-chip, comprising:
   a semiconductor memory part that is formed by the semiconductor memory element according to claim 1;
   a functional part that is configured to transmits and receives the data signal to and from the semiconductor memory part when executing a predetermined function using the data stored in the semiconductor memory element; and
   a control part that is configured to control the semiconductor memory element and the functional part and to receive the uncorrectable error signal,
   wherein when an uncorrectable error is detected in the data read from the semiconductor memory part, the semiconductor memory part is configured to transmit the uncorrectable error signal to the control part, and the control part is configured to transmit a control signal to at least one of the semiconductor memory part and the functional part and to execute a predetermined process on at least one of the semiconductor memory element and the functional part.

* * * * *